(12) United States Patent
Takahashi

(10) Patent No.: US 9,134,382 B2
(45) Date of Patent: Sep. 15, 2015

(54) PREDICTING STATE OF A BATTERY

(75) Inventor: Toshihiro Takahashi, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 13/603,498

(22) Filed: Sep. 5, 2012

(65) Prior Publication Data

US 2013/0013236 A1 Jan. 10, 2013

Related U.S. Application Data

(63) Continuation of application No. 13/539,536, filed on Jul. 2, 2012.

(30) Foreign Application Priority Data

Jul. 8, 2011 (JP) .................................. 2011-152364

(51) Int. Cl.
*G01N 27/416* (2006.01)
*G01R 31/36* (2006.01)

(52) U.S. Cl.
CPC ........ *G01R 31/3651* (2013.01); *G01R 31/3662* (2013.01)

(58) Field of Classification Search
USPC ........................................................ 324/430
See application file for complete search history.

(56) References Cited

U.S. PATENT DOCUMENTS

2003/0184307 A1 * 10/2003 Kozlowski et al. ........... 324/427

FOREIGN PATENT DOCUMENTS

| JP | 09-215207 | 8/1997 |
|---|---|---|
| JP | 11-32442 | 2/1999 |
| JP | 2001-330654 | 11/2001 |
| JP | 2002-319438 | 10/2002 |
| JP | 2003-017138 A | 1/2003 |
| JP | 2003-092836 A | 3/2003 |
| JP | 2003-508881 | 3/2004 |
| JP | 2011-220900 A | 11/2004 |
| JP | 2005-19019 | 1/2005 |
| JP | 2007-195312 A | 8/2007 |
| JP | 2010-060384 A | 3/2010 |
| JP | 2010-127729 A | 6/2010 |
| JP | 2011-38857 | 2/2011 |
| JP | 2013-537620 A | 10/2013 |
| WO | WO2011/135609 | 11/2011 |

* cited by examiner

*Primary Examiner* — Edward Tso
*Assistant Examiner* — Robert Grant
(74) *Attorney, Agent, or Firm* — Derek S. Jennings; Patent Mining Works, LLC

(57) ABSTRACT

An observation model for calculating a capacity maintenance ratio of a battery. The capacity maintenance ratio is calculated on the basis of basic data representing an internal state of the battery (such as a feature quantity extracted from a positive and negative AC impedance curve plot), and a transition model for mapping a temporally preceding internal state and deterioration environment (SOC, that is, the battery capacity that is actually available, temperature, etc.) onto a current internal state are prepared in advance. Using the above models, a transition path of an internal state having the maximum likelihood, that is, the minimum sum of squares of differences between predictive values calculated from the above models and an actual value, is determined using an optimization method that is preferably dynamic programming, and the capacity maintenance ratio is predicted.

4 Claims, 4 Drawing Sheets

PREDICTING STATE OF A BATTERY

CROSS REFERENCE TO RELATED APPLICATION

The present application is a continuation of and claims priority from U.S. patent application Ser. No. 13/539,536, filed Jul. 2, 2012, which in turn claims priority under 35 U.S.C. 119 from Japanese Application 2011-152364, filed Jul. 8, 2011, the entire contents of both are incorporated herein by reference.

BACKGROUND OF THE INVENTION

1. Field of the Invention

The present invention relates to a system, method, and program product for estimating the state of a secondary battery used in various electronic devices, electrically powered devices, etc.

2. Description of the Related Art

In recent years, due to global warming and concerns about the depletion of oil resources, a transition towards a low-carbon society has been demanded. As one of the activities towards such a transition, the importance of secondary batteries is increasing in industrial areas, such as electric power transactions using secondary batteries in electric power grids, peak shifts using secondary batteries in factories, and the change of power systems from internal combustion engines using energy from oil to electric motors using energy from electric power.

However, there is a problem in that the repeated charging and discharging of secondary batteries causes gradual decreases in the charging rate. A reduction in the performance of a secondary battery leads to a reduction in the range and other travel functions of a motor vehicle in which the secondary battery is used as a driving source, and causes safety problems. Therefore, various technologies for estimating the state of a secondary battery have been proposed in the related art.

Japanese Patent Application Publication No. 9-215207 discloses a technology in a system for monitoring a battery having discharging/charging cycles, for providing predictive information relating to the instant at which a predetermined threshold of the battery discharge voltage will be reached using a neural network.

Japanese Patent Application Publication No. 11-32442 discloses a technology in which, in order to allow the charge and discharge voltage and current of a load such as a motor and a storage battery to be digitally processed, the voltage and the current are converted into digital signals by different ND converters; the current and the voltage are further converted into complex spectra by a voltage frequency converter and a current frequency converter; impedance is calculated by an impedance calculation unit from the obtained complex spectra of the voltage and the current when the storage battery is in use; a radius, which is an impedance characteristic, is determined from the storage battery that is in operation; the determined radius is compared with a radius determined in advance and stored in a battery remaining capacity calculation unit; and the remaining capacity of the storage battery is estimated from the relationship between the radii.

Japanese Patent Application Publication No. 2002-319438 discloses a technology in which, in order to achieve an accurate and reproducible estimation of the state of charge of a battery to successfully operate a hybrid power train of a vehicle incorporating a battery pack: a state vector that describes the state of the battery is generated; a response to the state vector is estimated, a battery response is measured; and the state vector is modified on the basis of the difference between the estimated response and the measured response to determine the state of the battery.

Japanese Patent Application Publication No. 2011-38857 discloses a technology relating to a capacity maintenance ratio determination device capable of accurately determining a capacity maintenance ratio of a battery within a short period of time without completely charging/discharging the battery. The capacity maintenance ratio determination device includes an impedance measurement unit and a capacity estimation unit, an alternating signal is supplied to the battery from a signal generation unit, and the impedance measurement unit calculates the frequency characteristics of the AC impedance on the basis of a response signal from the battery in response to the alternating signal. A feature frequency is determined from the calculated frequency characteristics. The capacity estimation unit includes a memory and a determination unit. The memory stores relationships among the temperature of the battery, the feature frequency, and the capacity maintenance ratio. The determination unit determines the capacity maintenance ratio of the battery, based upon the temperature of the battery that is detected by a temperature detection unit, the determined feature frequency, and the relationships stored in the memory.

The related art publications described above disclose technologies for estimating the performance of a battery on the basis of an impedance characteristic of the battery in operation, the frequency characteristics of the AC impedance measured on the basis of a response signal from the battery, the temperature of the battery, etc. However, these technologies are not battery performance estimation technologies that take the internal battery state into account nor do they take the battery use history into account, thus causing an inaccurate prediction of deterioration of the battery.

One parameter of state known as the internal battery state is an AC impedance curve plot. This is a plot of values representing two components of impedance, including the original resistance, capacitance, and frequency. The resistive component and capacitive component of impedance are measured at various frequencies and are plotted on the horizontal axis and vertical axis, respectively. Thus, a semicircle is obtained, where the diameter of the semicircle represents the original resistance. The use of the above measured values allows more accurate prediction of the deterioration of a battery. However, there exists a problem in that a measurement device for measuring an AC impedance curve plot is expensive. For the foregoing reasons, it is difficult to readily measure the internal battery state when a secondary battery is in use. The internal battery state can also be measured at limited timings such as during maintenance or during recycling of the battery.

BRIEF SUMMARY OF THE INVENTION

In order to overcome these deficiencies, the present invention provides a battery state prediction method for predicting a capacity maintenance ratio of a battery under control of a computer, the method including: preparing an observation model for calculating the capacity maintenance ratio on the basis of basic data representing an internal state of the battery, and a transition model for mapping a temporally preceding internal state and deterioration environment onto a current internal state; and determining the current internal state of the battery by finding out a transition path of the internal state having a minimum sum of squares of differences between predictive values calculated from the observation model and the transition model and an actual value, on the basis of a value of the battery measured at each time step.

According to another aspect, the present invention provides a battery state prediction computer program product for predicting a capacity maintenance ratio of a battery under control of a computer, the computer program product including: a computer readable storage medium having computer readable non-transient program code embodied therein, the computer readable program code including: computer readable program code configured to perform the steps of: preparing an observation model for calculating the capacity maintenance ratio on the basis of basic data representing an internal state of the battery, and a transition model for mapping a temporally preceding internal state and deterioration environment onto a current internal state; and determining the current internal state of the battery by finding out a transition path of the internal state having the minimum sum of squares of differences between predictive values calculated from the observation model and the transition model and an actual value, on the basis of a value of the battery measured at each time step.

According to yet another aspect, the present invention provides a battery state prediction system for predicting a capacity maintenance ratio of a battery under control of a computer, including: storage means, wherein the storage means stores: data relating to an observation model for calculating the capacity maintenance ratio on the basis of basic data representing an internal state of the battery, and data relating to a transition model for mapping a temporally preceding internal state and deterioration environment onto a current internal state; and means for determining a current internal state of the battery by finding out a transition path of the internal state having the minimum sum of squares of differences between predictive values calculated from the observation model and the transition model and an actual value, on the basis of a value of the battery measured at each time step.

DETAILED DESCRIPTION OF THE PREFERRED EMBODIMENTS

Figure 1:
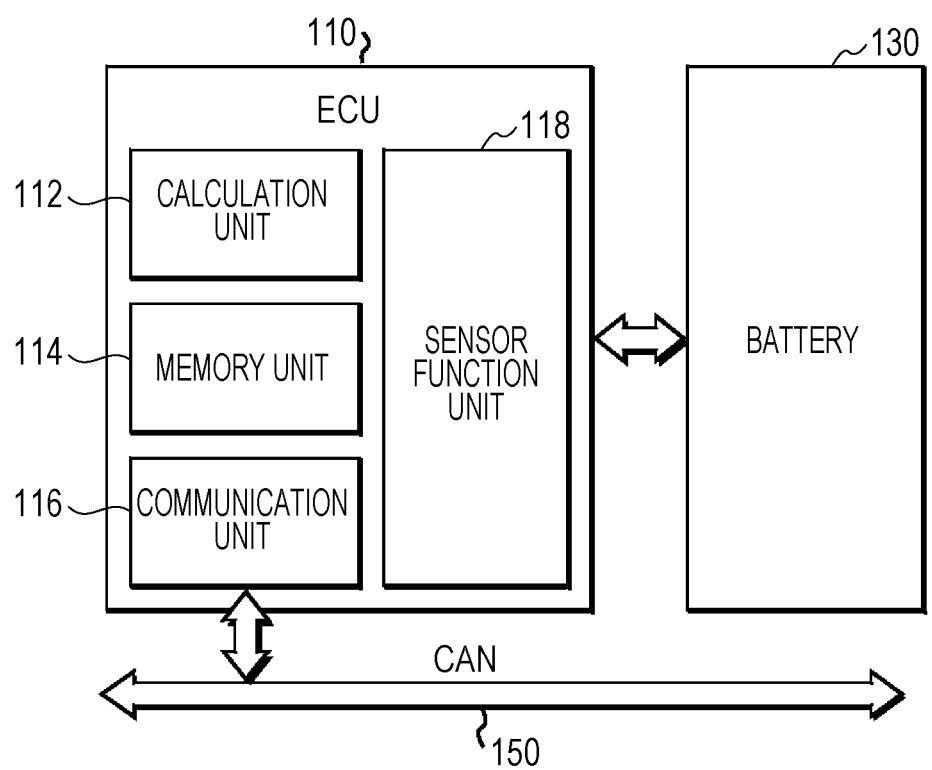
FIG. 1 is a block diagram illustrating a configuration including a battery ECU and a battery.

It is an object of the present invention to provide a technique for predicting, by using a measured value of a battery (or cell) that can be comparatively easily measured, a capacity maintenance ratio of the battery through statistical calculation on the basis of a predetermined statistical model.

An embodiment of the present invention will be described hereinafter with reference to the drawings. The same reference numerals denote the same objects throughout the drawings unless otherwise indicated. It is to be noted that the following description provides an embodiment of the present invention and this invention is not to be limited to the embodiment disclosed.

FIG. 1 is a block diagram of a hardware configuration for implementing the present invention. In an exemplary implementation, the present invention is implemented as part of an in-vehicle system although the present invention is not limited thereto. It is to be noted that, in particular, FIG. 1 illustrates only a portion of the in-vehicle system that relates to the present invention.

FIG. 1 illustrates a battery ECU 110, a battery 130, and an in-vehicle network 150 such as a CAN (control area network).

The battery ECU 110 includes a calculation unit 112 having a CPU, a memory unit 114 having non-volatile memories such as a RAM, ROM, or flash memory, a communication unit 116 that exchanges information such as data frames with the in-vehicle network 150, and a sensor function unit 118 that senses the state of the battery 130.

The battery 130 is, in an embodiment, a rechargeable battery that can be used for an electric vehicle or a hybrid vehicle.

The sensor function unit 118 includes elements for individually measuring the voltage, current, temperature, insulation resistance, etc. of the battery 130. The calculation unit 112 has a function of determining the SOC (state of charge) and the like through calculation on the basis of measurement data of the sensor function unit 118. The SOC can be determined using the calculation method described in, for example, Japanese Patent Application Publication No. 2001-330654, Japanese Patent Application Publication (Translation of PCT Application) No. 2003-508881, or Japanese Patent Application Publication No. 2005-19019.

The memory unit 114 includes a program corresponding to an operating system for controlling the overall operation of the ECU 110.

The memory unit 114 further includes a module for executing a function of predicting the capacity maintenance ratio of the battery 130 according to the present invention, in accordance with the measurement data of the sensor function unit 118 on the basis of data for an observation model, data for a transition model, the observation model, and the transition model.

The function of predicting the capacity maintenance ratio of a battery will be described in more detail below.

Figure 2:
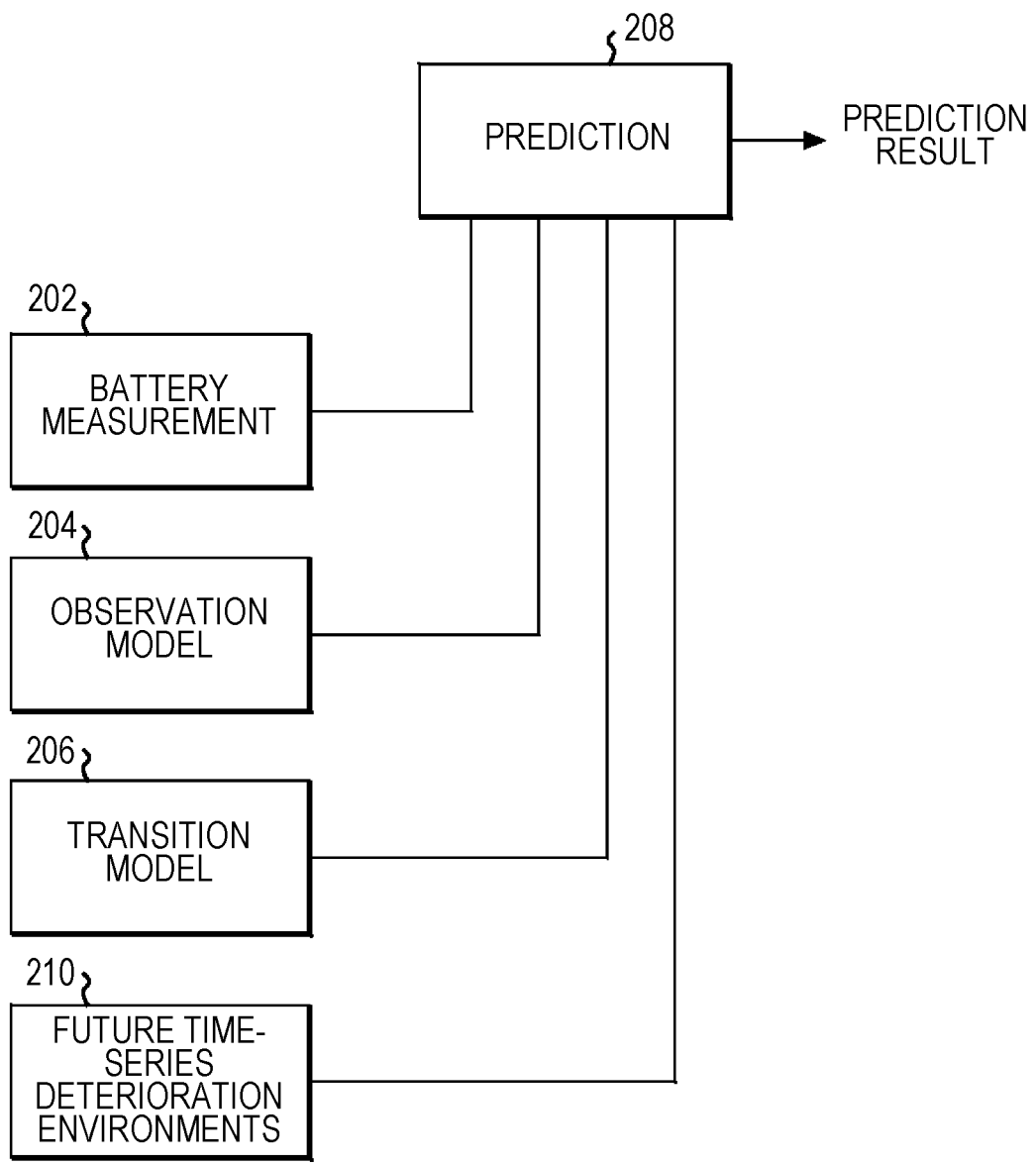
FIG. 2 is a functional logic block diagram for implementing the present invention.

Next, the processing function according to the present invention will be described with reference to a block diagram in FIG. 2. In FIG. 2, a battery measurement block 202 is a block representing the function of the sensor function unit 118, and provides measured values of the battery 130, such as voltage, current, temperature, and insulation resistance.

An observation model 204 stores N sets of internal state vectors zi and corresponding capacity maintenance ratios $y_i$, which have been measured in advance by using a deterioration test, $\{y_i\}$, $\{z_i\}$, where i=1, 2, . . . , N. The observation model 204 also includes the definition of an equation below for calculating a capacity maintenance ratio y for a given parameter z using $\{y_i\}$, $\{z_i\}$, where i=1, 2, . . . , N, which are stored in the above manner. A prediction block 208 is in charge of calculating the capacity maintenance ratio y using the equation. The parameter z is preferably two-dimensional, and can be a two-dimensional representation having two feature quantities obtained by modifying some values extracted from an AC impedance curve. For example, feature point 1=imaginary axis at a frequency of 2000 Hz—imaginary axis at a frequency of 100 Hz, feature point 2=real axis at a frequency of 1600 Hz—real axis at a frequency of 100 Hz, etc.

$$y = f(z) = \frac{\sum_i y_i \exp\left(-\frac{\|z-z_i\|^2}{2\sigma_k^2}\right)}{\sum_i \exp\left(-\frac{\|z-z_i\|^2}{2\sigma_k^2}\right)} \quad \text{[Eqn. 1]}$$

where σk denotes the variance, assuming that {zi} is under a normal distribution.

The equation representing the observation model 204 is not limited to the above equation, and any equation of regression from the internal state Z to the capacity maintenance ratio y can be used. For example, an equation below can also be used.

$$y = f(z) = \frac{1}{N} \sum_{i \in G} y_i \quad \text{[Eqn. 2]}$$

where G is the set of N nearest neighbors of z.

The regression model used here is desirably a nonlinear regression model in terms of compatibility with dynamic programming.

A transition model 206 is a model configured to move in a certain direction when a deterioration environment is given, and has four pieces of data $a_e(s, T)$, $a_c(s, T)$, $h_e(s, T)$, and $h_c(s, T)$.

$a_e(s, T)$ represents the movement speed of the internal state z of the battery 130 per unit time when the battery 130 is left in each deterioration environment (SOC s, temperature T), and is determined in advance through measurement using the battery 130. For example, data for each matrix whose vertical axis represents an SOC scale ranging from 0% to 100% that is equally divided into ten parts in units of ten and whose horizontal axis shows increments of five degrees, starting with less than −30° C., −30° C. to −25° C., −25° C. to −20° C., . . . , 0° C. to 5° C., 5° C. to 10° C., . . . , 10° C. to 15° C., . . . , 55° C. to 60° C., and 60° C. or more, is presented in table form.

$a_c(s, T)$ represents the movement speed of the internal state z of the battery 130 per unit amount of conduction when the battery 130 is conducted in each deterioration environment (SOC s, temperature T), and is determined in advance through measurement using the battery 130. For example, data for each matrix whose vertical axis represents an SOC scale ranging from 0% to 100% that is equally divided into ten parts in units of ten and whose horizontal axis shows increments of five degrees, starting with less than −30° C., −30° C. to −25° C., −25° C. to −20° C., . . . , 0° C. to 5° C., 5° C. to 10° C., . . . , 10° C. to 15° C., . . . , 55° C. to 60° C., and 60° C. or more, is presented in table form.

$h_e(s, T)$ represents a histogram of time measurements for a certain period when the battery 130 stays in the state of a deterioration environment (SOC s, temperature T). The histogram is determined in advance through measurement using the battery 130.

$h_c(s, T)$ represents a histogram of the amount of conduction for a certain period when the battery 130 is conducted with the state of a deterioration environment (SOC s, temperature T). The histogram is determined in advance through measurement using the battery 130.

The transition model 206 also includes the definition of an equation below. The prediction block 208 calculates, based on the internal state $z_t$ at time t, the internal state $z_{t+1}$ at subsequent time t+1 using the following equation.

$$z_{t+1} = g(z_t, h_e, h_c) \quad \text{[Eqn. 3]}$$
$$= z_t + \sum_{s,T} h_e(s, T) a_e(s, T) + \sum_{s,T} h_c(s, T) a_c(s, T)$$

Further, the prediction block 208 loads future time-series deterioration environments $w_{t+1}, w_{t+2}, w_{t+3}, \ldots$ from a block 210 in order to predict the capacity maintenance ratio of the battery in the future. The data on the future time-series deterioration environments in the block 210 may be determined in advance from the future driving plan, driving habits, etc. For example, if a user commutes for work by car, future time-series deterioration environments can be determined on the basis of the distance of a Monday-to-Friday commute, their weekend use plan, etc.

Next, the process of the prediction block 208 will be described in more detail. The process of the prediction block 208 is to determine the internal state $z_t$ at time t from the data on previous time-series deterioration environments $\{w_t\}$ and capacity maintenance ratios $\{y_t\}$.

Here, $w_t = \{h_{e,t}, h_{c,t}\}$,
where $h_{e,t}$ denotes the value of $h_e(s, T)$ at time t, which is given in equation 3, and $h_{c,t}$ denotes the value of $h_c(s, T)$ at time t, which is given in equation 3.

Accordingly, the cost for a transition from the internal state $z_t$ at time t to the internal state $z_{t+1}$ at time t+1 is defined as follows.

$$C(z_t, z_{t+1}, y_t, y_{t+1}, w_t) = \frac{\|z_{t+1} - g(z_t, w_t)\|^2}{2\sigma_{tra}^2} + \frac{\|y_{t+1} - f(z_{t+1})\|^2}{2\sigma_{obs}^2} \quad \text{[Eqn. 4]}$$

where $\sigma_{obs}$ denotes the variance of noise of the observation model, and $\sigma_{tra}$ denotes the variance of noise of the transition model.

The following process according to the present invention is further performed.

I. Discretize the internal states $\{z_t\}$ at the respective times t into N parts, and create a table for storing the cost for each time. The obtained tables are represented by $Z_{t,0}, Z_{t,1}, \ldots,$ and $Z_{t,N-1}$;

II. Initialize the internal state $Z_{0,p}$ at time 0 that is obtained through discretization. Since the initial value $z_0$ of the internal state is 0, a value of 0 is set only for this value and a value as large as ∞, which is actually impossible, is set otherwise;

III. Then, set the time to 0;
  a. Focus attention on the p-th internal state $Z_{t+1,p}$ at time t+1;
    i. Focus attention on the q-th internal state $Z_{t,q}$ at time t, and calculate the cost $C(Z_{t,q}, Z_{t+1,p})$ for a transition between the two states;
    ii. Calculate $C(Z_{t,q}, Z_{t+1,p})$ for all the q-th internal states, and determine $c_{min}$ whose $C(Z_{t,q}, Z_{t+1,p}) + Z_{t,q}$ becomes minimum;
    iii. Store $c_{min}$ in $Z_{t+i,p}$;
  b. Perform the above process for all the p-th internal states;

IV. Increment the time t and repeatedly perform the above process. Terminate the process when the time t has reached the current time; and V. Search for the table having the minimum cost among the costs $Z_{t,0}, Z_{t,1}, \ldots,$ and $Z_{t,N-1}$ at time t, and use the corresponding internal state as the current internal state $u_t$.

Figure 3:
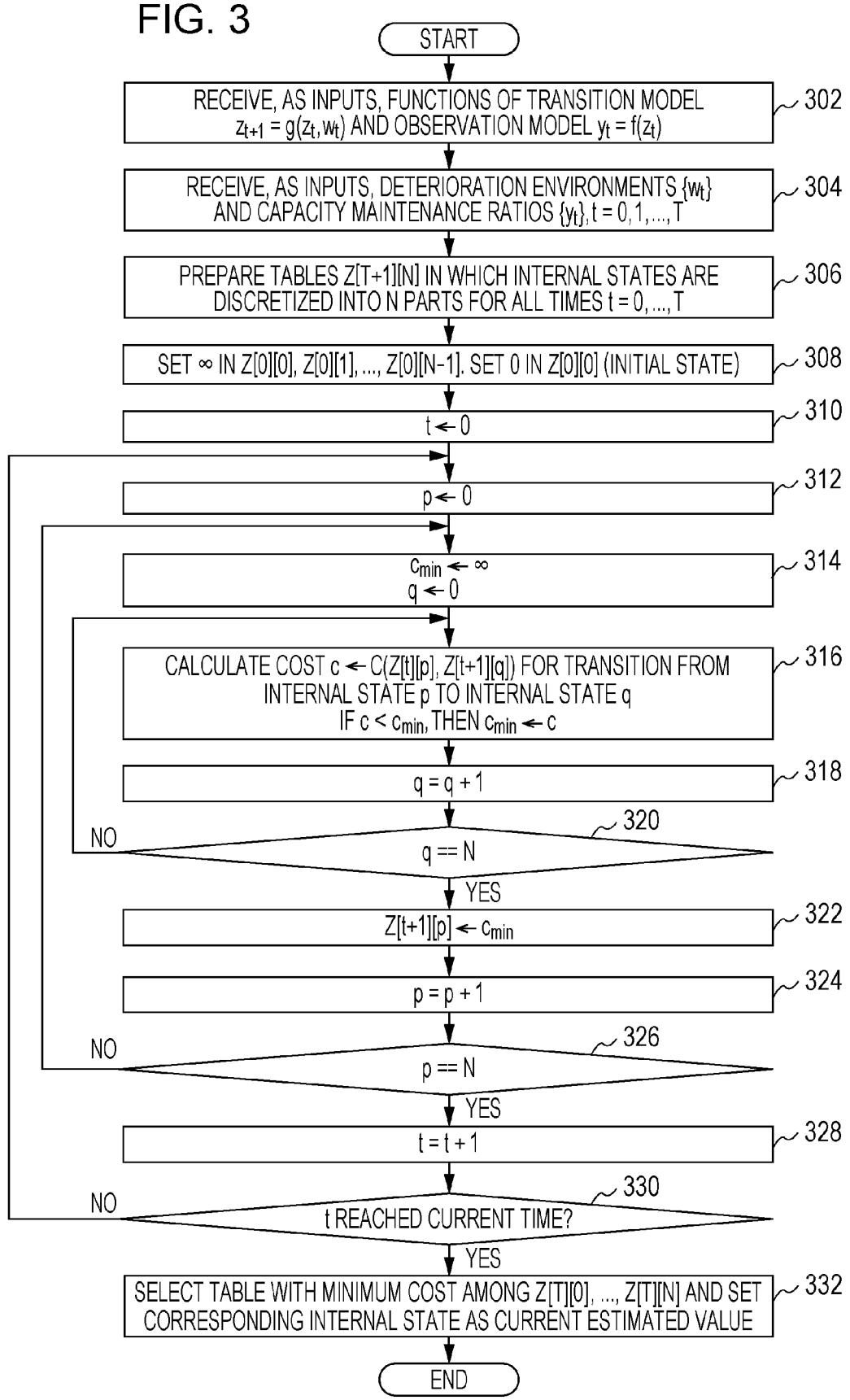
FIG. 3 is a diagram illustrating a flowchart of a process for estimating the internal state of a battery according to the present invention.

Next, the above process will be described with reference to a flowchart in FIG. 3. In FIG. 3, in step 302, the prediction block 208 receives, as inputs, the function of the transition model $z_{t+1}=g(z_t,w_t)$ and the function of the observation model $y_t=f(z_t)$.

Then, in step 304, the prediction block 208 receives, as inputs, the deterioration environments $\{w_t\}$ and the capacity maintenance ratios $\{y_t\}$, where t=0, 1, . . . , T. These values may be determined by performing, using the prediction block 208, a calculation process on a measurement result obtained from the battery measurement block 202, if necessary.

Then, in step 306, the prediction block 208 prepares tables Z[T+1][N], in which internal states are discretized into N parts, for all the times T=0, 1, . . . , T. In an embodiment, the tables are reserved in a RAM area of the memory unit 114.

Then, in step 308, the prediction block 208 sets ∞ in Z[0][0], Z[0][1], . . . , and Z[0][N−1]. Then, the prediction block 208 sets 0 in Z[0][0] (initial state).

Then, in step 310, the prediction block 208 sets 0 in the time variable t.

Then, in step 312, the prediction block 208 sets 0 in the variable p. Then, in step 314, the prediction block 208 sets ∞ in the variable $c_{min}$, and sets 0 in the variable q.

Then, in step 316, the prediction block 208 calculates the cost C(Z[t][p], Z[t+1]) for a transition from the internal state p to the internal state q, and sets the calculated cost to c. If $c<c_{min}$, then $c_{min}$ is set as c. The cost is calculated using the functions input in step 302.

In step 318, the prediction block 208 increments q by 1. In step 320, the prediction block 208 determines whether or not q is equal to N. If q has not reached N, the process returns to step 316.

If it is determined that q is equal to N, the process proceeds to step 322, in which the prediction block 208 sets $c_{min}$ to Z[t+1][p]. In step 324, the prediction block 208 increments p by 1. In step 326, the prediction block 208 determines whether or not p is equal to N. If p has not reached N, the process returns to step 314.

If it is determined that p has reached N, in step 328, the prediction block 208 increments t by 1. In step 330, it is determined whether or not the time t has reached the current time. If the time t has not reached the current time, the process returns to step 312.

If it is determined in step 330 that the time t has reached the current time, in step 332, the prediction block 208 selects the table with the minimum cost among Z[T][0], Z[T][1], . . . , and Z[T][N], and sets the corresponding internal state as the current estimated value.

Figure 4:
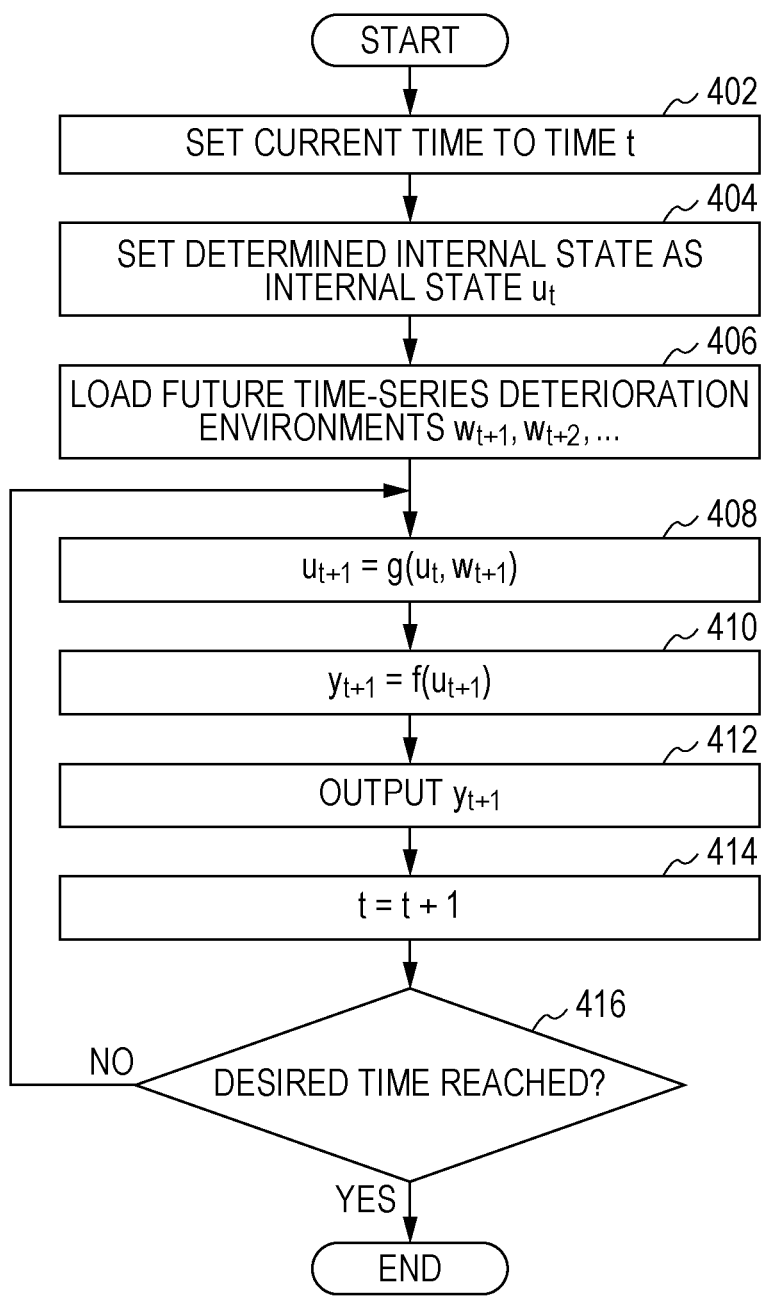
FIG. 4 is a diagram illustrating a flowchart of a process for predicting a capacity maintenance ratio of a battery on the basis of the value of the internal state of the battery.

Next, a method for predicting future time-series capacity maintenance ratios $y_{t+1}$, $y_{t+2}$, from the internal state $u_t$ determined in the above manner will be described with reference to a flowchart in FIG. 4.

In step 402, the prediction block 208 sets the current time to the time t.

Then, in step 404, the prediction block 208 sets, as the internal state $u_t$, the internal state determined in the process illustrated in the flowchart in FIG. 3.

Then, in step 406, the prediction block 208 loads future time-series deterioration environments $w_{t+1}$, $w_{t+2}$, $w_{t+3}$, . . . from the block 210. Preferably, future time-series deterioration environments are determined from the future driving plan of the vehicle. If it is expected that the future driving plan will not change from the previous one very much, the previous time-series deterioration environments can be used as they are for the future ones.

Then, in step 408, the prediction block 208 calculates the internal state $u_{t+1}$ at the subsequent time by $u_{t+1}=g(u_t, w_{t+1})$.

Then, in step 410, the prediction block 208 calculates $y_{t+1}$ using $u_{t+1}$ calculated in step 408 by $y_{t+1}=f(u_{t+1})$.

Then, in step 412, the prediction block 208 outputs $y_{t+1}$ obtained as a result of calculation by using a method such as writing the result in the flash memory in the memory unit 114.

Then, in step 414, the prediction block 208 increases the time t by 1. In step 416, it is determined whether or not the time t has reached the desired time. If the time t has not reached the desired time, the process returns to step 408. If, in step 416, the time t has reached the desired time, the process ends.

The prediction technique according to the present invention is particularly effective for the same capacity maintenance ratio and an unbalanced deterioration of the positive and negative terminals. An unbalanced deterioration of the positive and negative terminals greatly affects the actual deterioration speed of the capacity maintenance ratio. A conventional technique for predicting the deterioration speed of the capacity maintenance ratio by using changes in the capacity maintenance ratio does not take an unbalanced deterioration of the positive and negative terminals into account, resulting in low prediction accuracy.

The prediction technique according to the present invention is based on the calculation that takes an unbalanced deterioration of the positive and negative terminals into account. Therefore, more accurate prediction of the deterioration speed of the capacity maintenance ratio is achieved.

While the present invention has been described in accordance with an exemplary embodiment of an in-vehicle system, a person skilled in the art would understand that the present invention is applicable to the prediction of the deterioration speed of the capacity maintenance ratio of a charger for any product that uses a charger.

What is claimed is:

1. A battery state prediction system for predicting a capacity maintenance ratio of a battery under control of a computer, comprising:
    storage means, wherein said storage means stores: data relating to an observation model for calculating said capacity maintenance ratio on the basis of basic data representing an internal state of said battery, and data relating to a transition model for mapping a temporally preceding internal state and deterioration environment onto a current internal state; and
    means for determining a current internal state of said battery by finding out a transition path of said internal state having the minimum sum of squares of differences between predictive values calculated from said observation model and said transition model and an actual value, on the basis of a value of said battery measured at each time step, wherein said basic data representing said internal state of said battery comprises a feature quantity extracted from a positive and negative AC impedance curve plot and said observation model is based on a nonlinear regression model.

2. The battery state prediction system according to claim 1, wherein finding out of said transition path of an internal state having the minimum sum of squares is performed using dynamic programming.

3. The battery state prediction system according to claim 1, wherein
    said storage means further stores data on future time-series deterioration environments of said battery, and
    said battery state prediction system further comprises means for sequentially estimating said capacity maintenance ratio of said battery in the future by applying said observation model and said transition model to said determined current internal state and to said data on future time-series deterioration environments of said battery.

4. The battery state prediction system according to claim 1, wherein said deterioration environment includes SOC and temperature.

* * * * *